(12) United States Patent
Gao (10) Patent No.: US 11,259,447 B2
(45) Date of Patent: Feb. 22, 2022

(54) COMPOSITE LIQUID COOLING DEVICE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 5 days.

(21) Appl. No.: 16/729,132

(22) Filed: Dec. 27, 2019

(65) Prior Publication Data
US 2021/0204450 A1 Jul. 1, 2021

(51) Int. Cl.
*H05K 7/20* (2006.01)
*G06F 1/20* (2006.01)

(52) U.S. Cl.
CPC .......... *H05K 7/20772* (2013.01); *G06F 1/20* (2013.01); *H05K 7/20254* (2013.01); *H05K 7/20272* (2013.01); *G06F 2200/201* (2013.01)

(58) Field of Classification Search
CPC .......... H05K 7/20772; H05K 7/20254; H05K 7/20272; H05K 7/20218; H05K 7/20627; H05K 7/20763; G06F 1/20; G06F 2200/201
USPC .................... 361/679.47, 698, 699, 701, 702
See application file for complete search history.

(56) References Cited

U.S. PATENT DOCUMENTS

| | | | | |
|---|---|---|---|---|
| 6,970,355 B2* | 11/2005 | Ellsworth, Jr | ........ | H01L 23/467 165/122 |
| 7,467,657 B2* | 12/2008 | Pawlak, III | ............... | G06F 1/20 165/104.33 |
| 2004/0095721 A1* | 5/2004 | Ellsworth, Jr. | ........ | H01L 23/467 361/694 |
| 2005/0082040 A1* | 4/2005 | Lee | ........................... | F28F 3/12 165/104.33 |
| 2006/0162898 A1* | 7/2006 | Reyzin | .................... | F28F 13/00 165/80.4 |
| 2006/0162903 A1* | 7/2006 | Bhatti | ....................... | F28F 3/12 165/104.14 |
| 2006/0162904 A1* | 7/2006 | Bhatti | .................... | H01L 23/427 165/104.14 |
| 2006/0185378 A1* | 8/2006 | Duan | ................. | H05K 7/20263 62/259.2 |
| 2006/0185830 A1* | 8/2006 | Duan | .................... | H01L 23/473 165/104.33 |

(Continued)

*Primary Examiner* — Stephen S Sul
(74) *Attorney, Agent, or Firm* — Womble Bond Dickinson (US) LLP (57) ABSTRACT

In one embodiment, an electronic cooling device includes an inlet port to receive cooling liquid from an external cooling liquid source. The cooling device further includes a base cooling unit having a first liquid distribution channel therein. The base cooling unit includes a cooling plate that forms a lower surface to be positioned on a top surface of one or more electronic devices to extract heat from the devices through the cooling plate using at least a portion of the cooling liquid from the external cooling liquid source. The cooling device further includes an upper cooling unit having a second liquid distribution channel to extract heat from air contacting the upper cooling unit using at least a portion of the cooling liquid received from the external cooling liquid source. The cooling device further includes an outlet port to return the cooling liquid to the external cooling liquid source. Internal fluid channel structural design can be used and customized for different applications and use cases.

20 Claims, 7 Drawing Sheets (56) References Cited

U.S. PATENT DOCUMENTS

| | | | |
|---|---|---|---|
| 2006/0283579 A1* | 12/2006 | Ghosh | H01L 23/473 165/104.33 |
| 2007/0272397 A1* | 11/2007 | Reyzin | H01L 23/473 165/122 |
| 2008/0060368 A1* | 3/2008 | Campbell | F25B 23/00 62/149 |
| 2009/0200007 A1* | 8/2009 | Foy | H01L 23/473 165/287 |
| 2016/0113149 A1* | 4/2016 | Krug, Jr | H05K 7/20781 361/679.53 |
| 2016/0270267 A1* | 9/2016 | Chainer | H05K 7/20327 |
| 2017/0196120 A1* | 7/2017 | Oprins | H05K 5/06 |
| 2019/0360764 A1* | 11/2019 | Liu | H05K 7/20272 |
| 2020/0315069 A1* | 10/2020 | Chiu | G06F 1/20 |

* cited by examiner

COMPOSITE LIQUID COOLING DEVICE

FIELD OF THE DISCLOSURE

Embodiments of the present invention relate generally to data centers. More particularly, embodiments of the invention relate a composite liquid cooling device.

BACKGROUND

Thermal management of a data center that includes several active electronic racks is critical to ensure proper performance of servers and other information technology (IT) equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high power density electronic racks, where more high density chips are packaged closer together to provide more processing power. One way to maintain a proper thermal environment in these high power density racks may be the use of liquid cooling.

Data centers may be large systems that include two major parts: IT equipment and the facility. These two parts are closely coupled with one another in all phases of operation. However, the lifetime of the facility is generally much longer than the IT equipment that it houses. Therefore, it can be a challenge for the facility to keep up with supporting and satisfying the IT deployment requirements. The difficulties may be compounded when the IT are cooled using both air cooling and liquid cooling techniques.

Additionally, edge computing has become an important and prevalent technology recently, especially in combination with 5G technology. Edge computing requires more compute and storage workload to be processed closer to the end user rather than at a core data center or central cloud environment. For example, in autonomous vehicles multiple sensors are assembled on the vehicle. The data collected by the sensors needs to be processed locally, which requires local vehicle computing hardware. The processing capability requirements for edge computing applications, such as autonomous vehicles, is constantly increasing and the environments in which they are deployed can vary greatly from the controlled environment of a data center. Edge computing devices may be deployed in harsh environments, including severe temperatures, humidity, air quality, weather conditions, etc. Therefore, these devices are required be deployed in a fully enclosed packaging. However, controlling the thermal environment of the electronic devices with different thermal design power and thermal specifications within a packaging that is fully enclosed becomes a new challenge and a new focus.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide an electronics cooling device design that can be applied across multiple hardware systems and platforms, including data center applications and edge computing devices. The design includes an upper cooling component, a base cooling component and fluid channels to distribute cooling fluid to the top and base cooling components. The upper cooling component functions as a liquid to air (liquid/air) cooling device (in some cases, used for cooling the air, in some other cases, used the air to cool its internal liquid), while the base cooling component is attached directly to electronics to function as a liquid cooling device. Internal fluid channels are used for both the upper cooling component and the base cooling component. At least two fluid ports are used to connect the device to an external cooling fluid source. Additionally, an air mover, such as a fan, can be assembled with the device for certain use cases to move air across the upper cooling component.

According to one embodiment, an electronic cooling device includes an inlet port to receive a cooling liquid from cooling liquid source external to the cooling device. The cooling device further includes a base cooling unit having a first liquid distribution channel integrated therein. The base cooling unit includes a cooling plate that forms a lower surface, the lower surface to be positioned on a top surface of one or more electronic devices to extract heat from the one or more electronics devices through the cooling plate using at least a portion of the cooling liquid received from the external cooling liquid source. The cooling device further includes an upper cooling unit having a second liquid distribution channel to exchange heat with air contacting the upper cooling unit using at least a portion of the cooling liquid received from the external cooling liquid source. The cooling device further includes an outlet port to return the cooling liquid form the base cooling unit and the upper cooling unit to the external cooling liquid source.

In one embodiment, the base cooling unit, the upper cooling unit, the inlet port and the outlet port are fixed together as a single composite device. The base cooling unit can be manufactured as a first layer, the inlet port and the outlet port can be manufactured as a second layer, and the upper cooling unit can be manufactured as a third layer. In another embodiment, the inlet port and the outlet port are coupled together in a layer as a single port unit that is positioned between the base cooling unit and the upper cooling unit.

In one embodiment, the cooling device includes an air moving unit (such as a fan) coupled to the upper cooling unit. The air moving unit is mounted on the upper cooling unit to move air along the surface of the upper cooling unit (i.e., around, or through the upper cooling unit). In one embodiment, the cooling device includes one or more air directing components (e.g., 650, FIG. 6) coupled to the upper cooling unit and the base cooling unit to direct airflow around the upper cooling unit.

In one embodiment, the upper module of the cooling device includes a first inlet to receive the cooling liquid from the inlet port and a first outlet to provide the cooling liquid to the outlet port. The base module includes a second inlet to receive the cooling liquid from the inlet port and a second outlet to provide the cooling liquid to the outlet port. The first inlet and second inlet can be arranged in parallel or in series so that a portion of the cooling liquid flows through each unit simultaneously or one after the other, respectively. In one embodiment, the upper cooling unit and the base cooling unit each include a plurality of liquid channels to provide uniform distribution of the cooling liquid to the upper cooling unit and the lower cooling unit. According to another embodiment, a server cooling system includes a plurality of the liquid cooling devices each positioned on the surface of one or more electronic devices.

According to another embodiment, the cooling device can be utilized as a cooling device disposed on the top of an electronic device of a data processing system (e.g., a processor of a server) to provide direct cooling to the electronic device and to provide air cooling to other electronic devices on the same motherboard. The data processing system may be one of the servers of an electronic rack of a data center, where the electronic rack typically includes an array of server blades arranged in a stack. The electronic rack may include a rack cooling liquid manifold to receive cooling liquid from an external cooling liquid source and to supply the cooling liquid to the cooling devices of each server blade.

Figure 1:
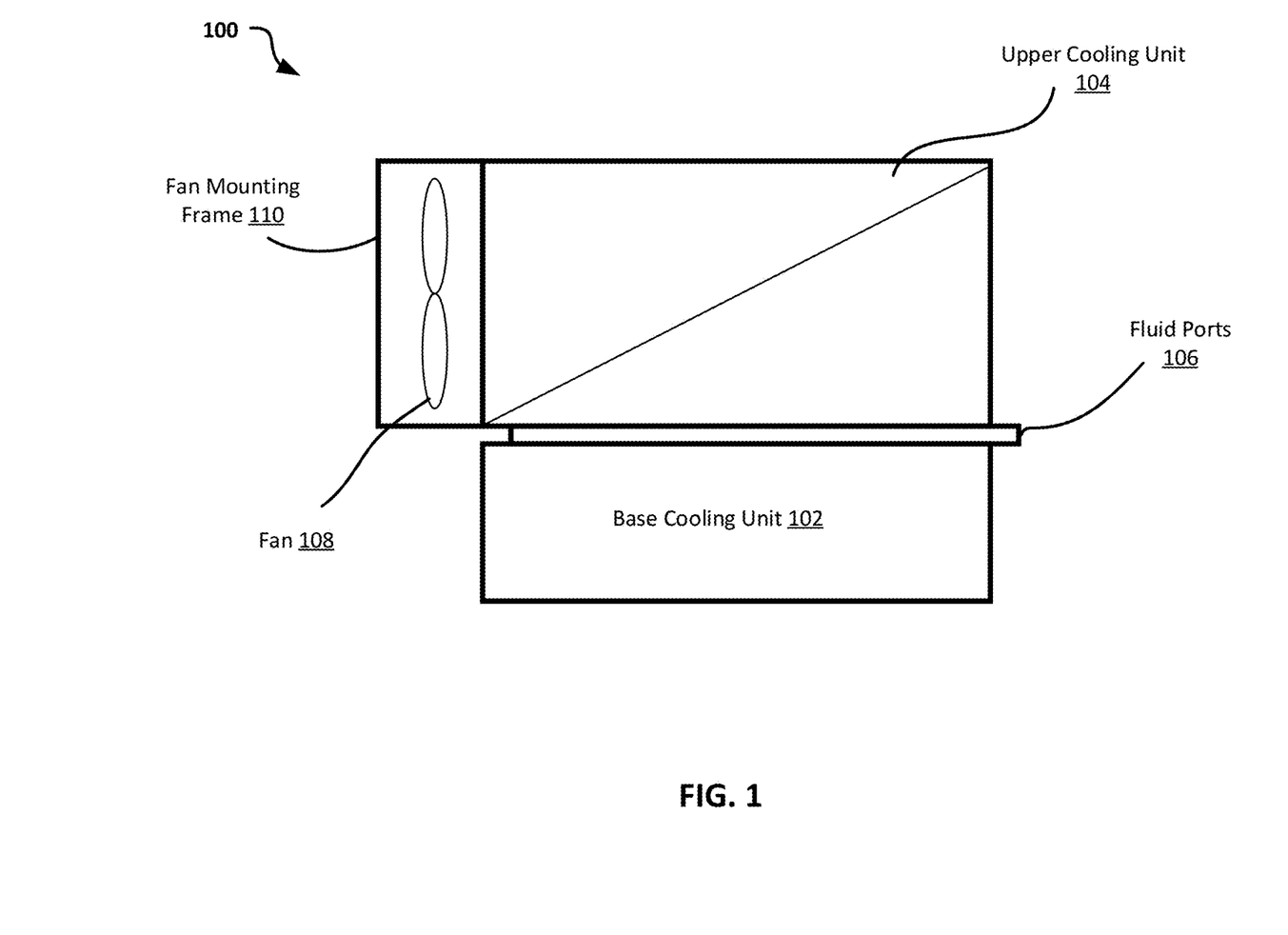
FIG. 1 is a block diagram illustrating a composite liquid cooling device according to one embodiment.

FIG. 1 is a block diagram illustrating an example of a composite liquid cooling device 100, as described above. FIG. 1 shows the simplified devices design structure. The device is composed by a top cooling unit and a based cooling plate as well as fluid ports. The three sections can be designed as one unit with detailed internal fluid structural inside it. The top cooling unit functions as a cooling device for the airflow. It includes internal fluid structural which enable to the cooling fluid distributed evenly across the top cooling unit. the cooling fluid then used to cool the air. The based cooling unit is used as a directly cooling devices which is used on the high performance processors, which are thermally managed by liquid cooling. Fluid ports connect to the external cooling fluid source.

The fan is used for moving the airflow passing thorough the top or upper cooling unit. When the cooling fluid is recirculating with the top cooling unit, the unit is used for cooling the air flow. When the fluid stops recirculating with the top cooling unit, the air flow moving by the fan is used for cooling the devices. The design enables flexible applications for different scenarios under different circumstances. The devices will be directly attached on to the liquid cooled electronics. The base cooling plate will be assembling on the top of these chips. Corresponding mounting method or mounting kit will be assembled on the devices which is not presented in the figures.

In one embodiment, the composite liquid cooling device 100 includes a base cooling unit 102, an upper cooling unit 104, and fluid ports 106. In one embodiment, the composite liquid cooling device further includes a fan 108 (or other air moving component) attached to the upper cooling unit 104 using a fan mounting frame 110. As described in more detail below with respect to FIGS. 2-5, the base cooling unit 102 and upper cooling unit 104 each includes one or more liquid distribution channels that distribute a cooling liquid through the base cooling unit 102 and the upper cooling unit 104. The cooling liquid is received at an inlet port of the fluid ports 106 from a cooling liquid source external to the composite liquid cooling device 100. The upper cooling unit 104 and base cooling unit 102 can each include an inlet port that receives the cooling liquid from the fluid ports 106.

The base cooling unit 102 can be attached directly to an electronic device, such as a high performance processor, to provide liquid cooling to the electronic device. Heat produced by the electronic device can be extracted through a cooling plate on the bottom surface of the base cooling unit 102 and carried away by the cooling liquid flowing through the liquid channels of the base cooling unit 102. The upper cooling unit 104 can extract heat from air that is in contact with the upper cooling unit 104 using the cooling liquid flowing through the liquid channels of the upper cooling unit 104. The fan 108 can move air across the surface of the upper cooling unit to cool the air and to circulate the air to additional air cooled electronics. Thus, the composite liquid cooling device 100 acts as a liquid cooling device for the electronic components to which the base cooling unit 102 is attached and an air cooling device for other electronic components within the same enclosure as the composite liquid cooling device 100. Additionally, if circulation of the cooling liquid fails, the composite liquid cooling device can continue to act as a heat sink for the electronic device to which it is attached due to heat extraction from the upper cooling device to the air.

Figure 2:
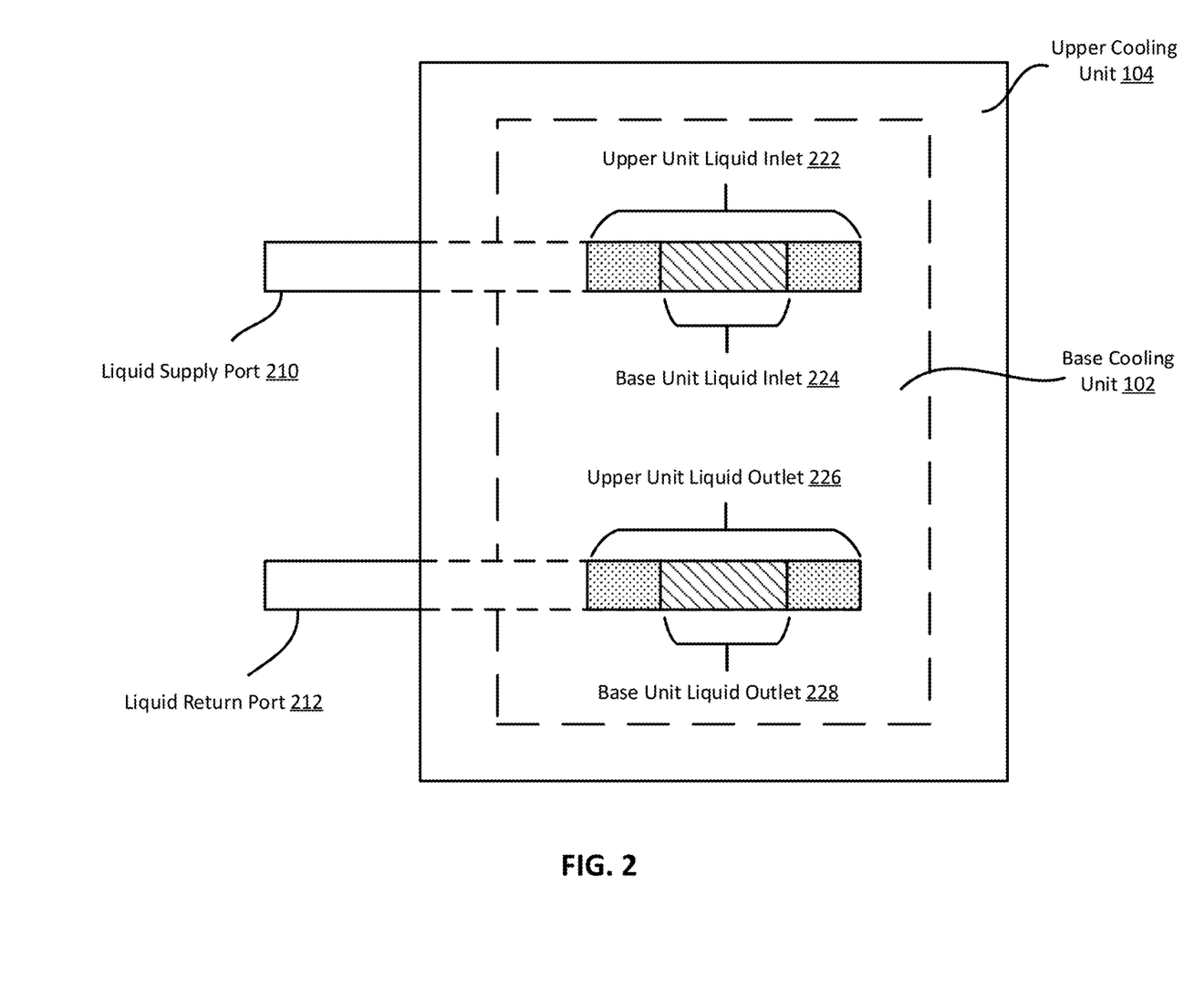
FIG. 2 is a block diagram illustrating a composite liquid cooling device according to another embodiment.

FIG. 2 is a block diagram illustrating a top view of a composite liquid cooling device. FIG. 2 presents a top view of the design of the device. The cooling unit is over the top of the base cooling plate. The two units can be understood as two separate sections but as one unit. the liquid supply and liquid return portion are connected to the external cooling loop or cooling source. In addition, the internal fluid structural as shown as provides fluid distribution to the top cooling unit and base cooling plate.

In one embodiment, the composite liquid cooling device includes a base cooling unit 102 and an upper cooling unit 104 that can be the same or similar to the base cooling unit 102 and the upper cooling unit 104, respectively, as described with respect to FIG. 1. The composite liquid cooling device further includes a liquid supply port 210 and a liquid return port 212. The liquid supply port 210 receives a cooling liquid from an external cooling liquid source and provides the cooling liquid to the base cooling unit 102 and the upper cooling unit 104. The liquid return port 212 receives the cooling liquid that has traversed internal liquid channels of the base cooling unit 102 and the upper cooling unit 104 and returns it to the external cooling liquid source. Thus, the liquid supply port 210 provides a cooling liquid to the base cooling unit 102 and the upper cooling unit 104 in which heat is extracted from electronics and the air, respectively, to the cooling liquid. The cooling liquid, along with the extracted heat, is then carried away from the composite liquid cooling device and back to the cooling liquid source via the liquid return port 212.

The liquid supply port 210 provides the cooling liquid to the upper cooling unit 104 through an upper unit liquid inlet 222. The upper unit liquid inlet 222 is an opening on the top side of the liquid supply port 210. The liquid supply port 210 provides the cooling liquid to the base cooling unit 102 via a base unit liquid inlet 224. The base unit liquid inlet 228 is an opening on the bottom side of the liquid supply port 210. The upper unit liquid inlet 222 and the base unit liquid inlet 224 may be the same or different sizes (as depicted). Similarly, an upper unit liquid outlet 226 can provide the cooling liquid from the upper cooling unit 104 to the liquid return port 212, and a base unit liquid outlet 228 can provide the cooling liquid from the base cooling unit 102 to the liquid return port 212.

Figure 3:
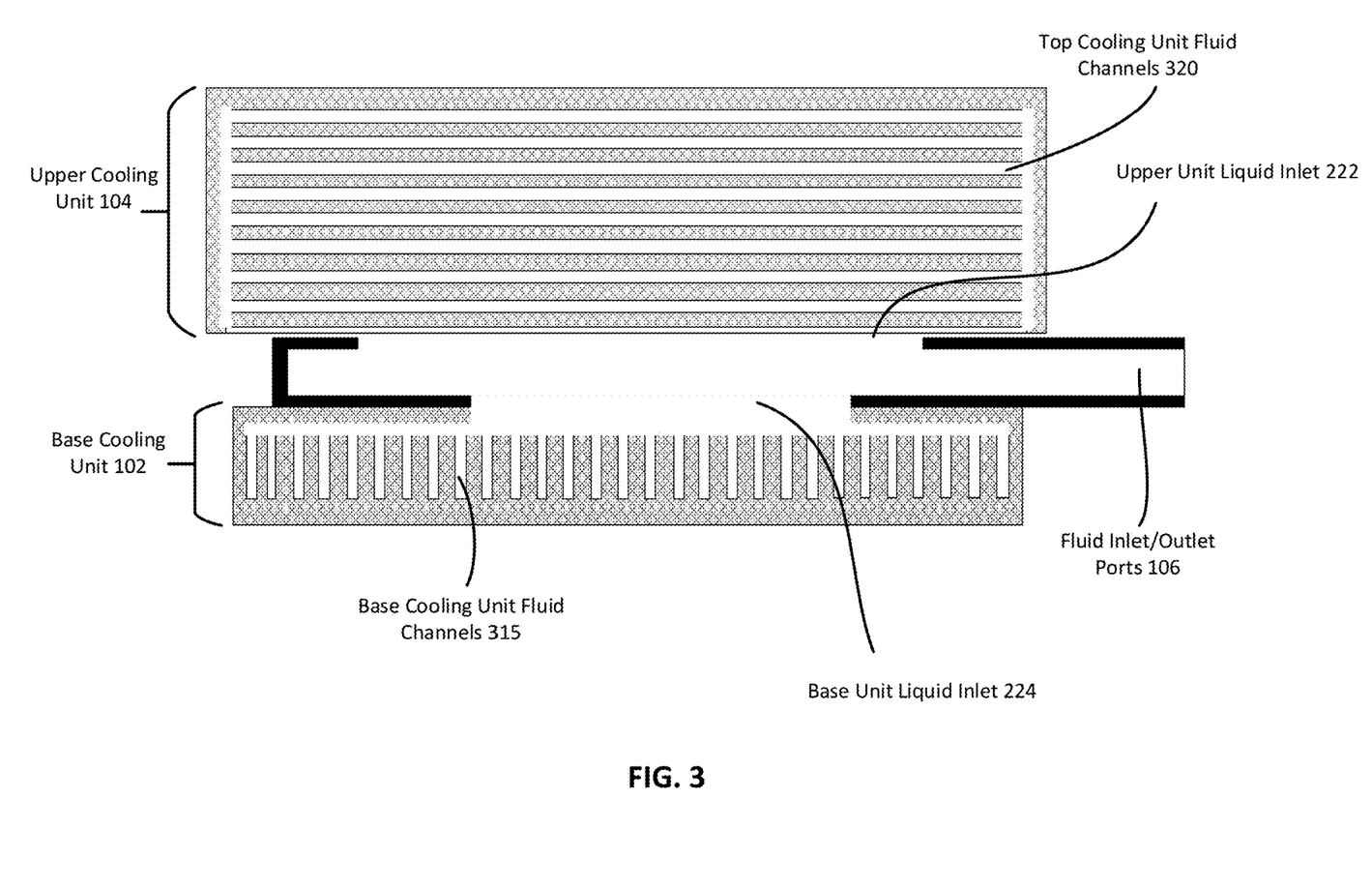
FIG. 3 shows side view of a composite liquid cooling device according to one embodiment.
Figure 4:
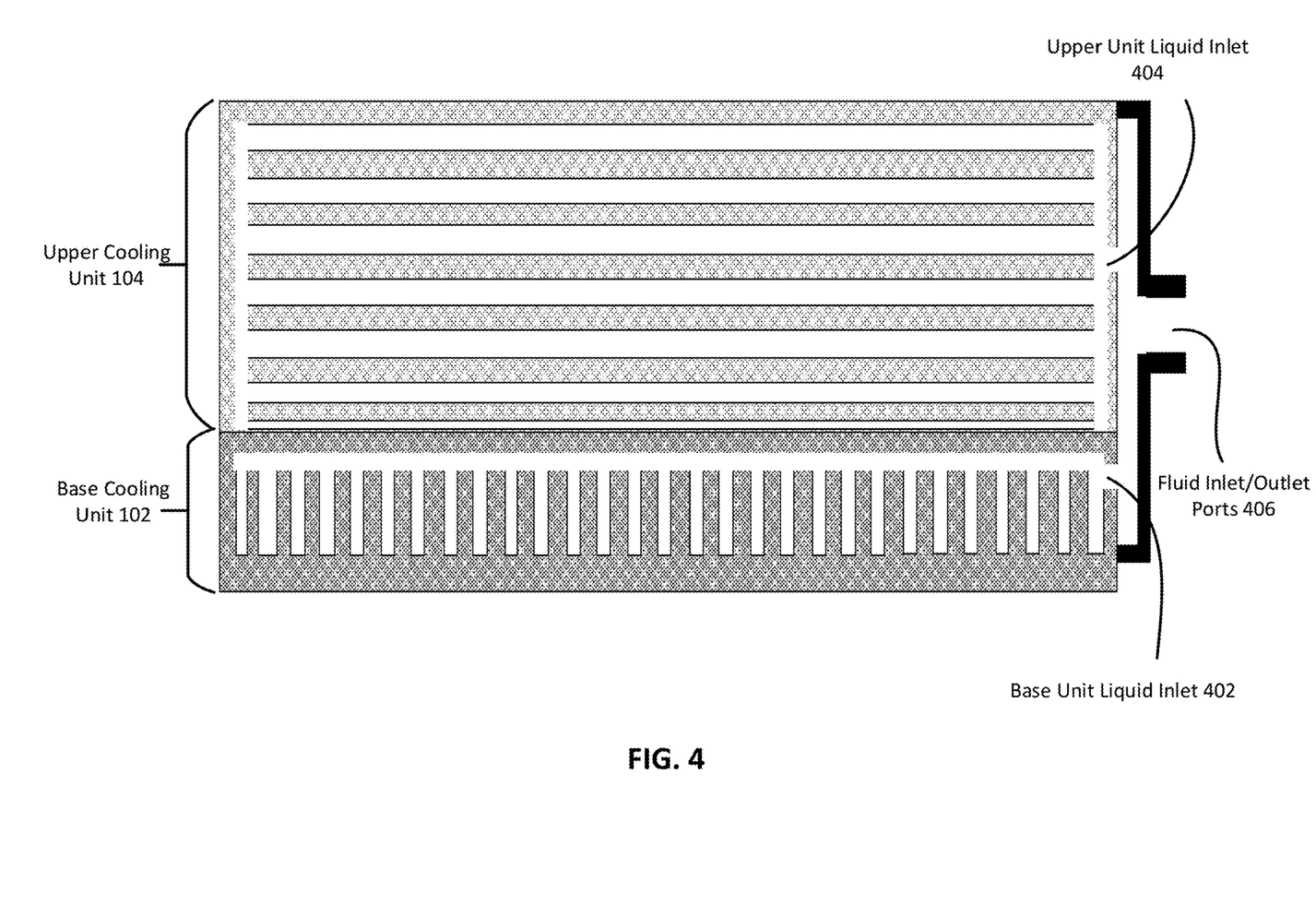
FIG. 4 shows a side view of a composite liquid cooling device according to another embodiment.
Figure 5:
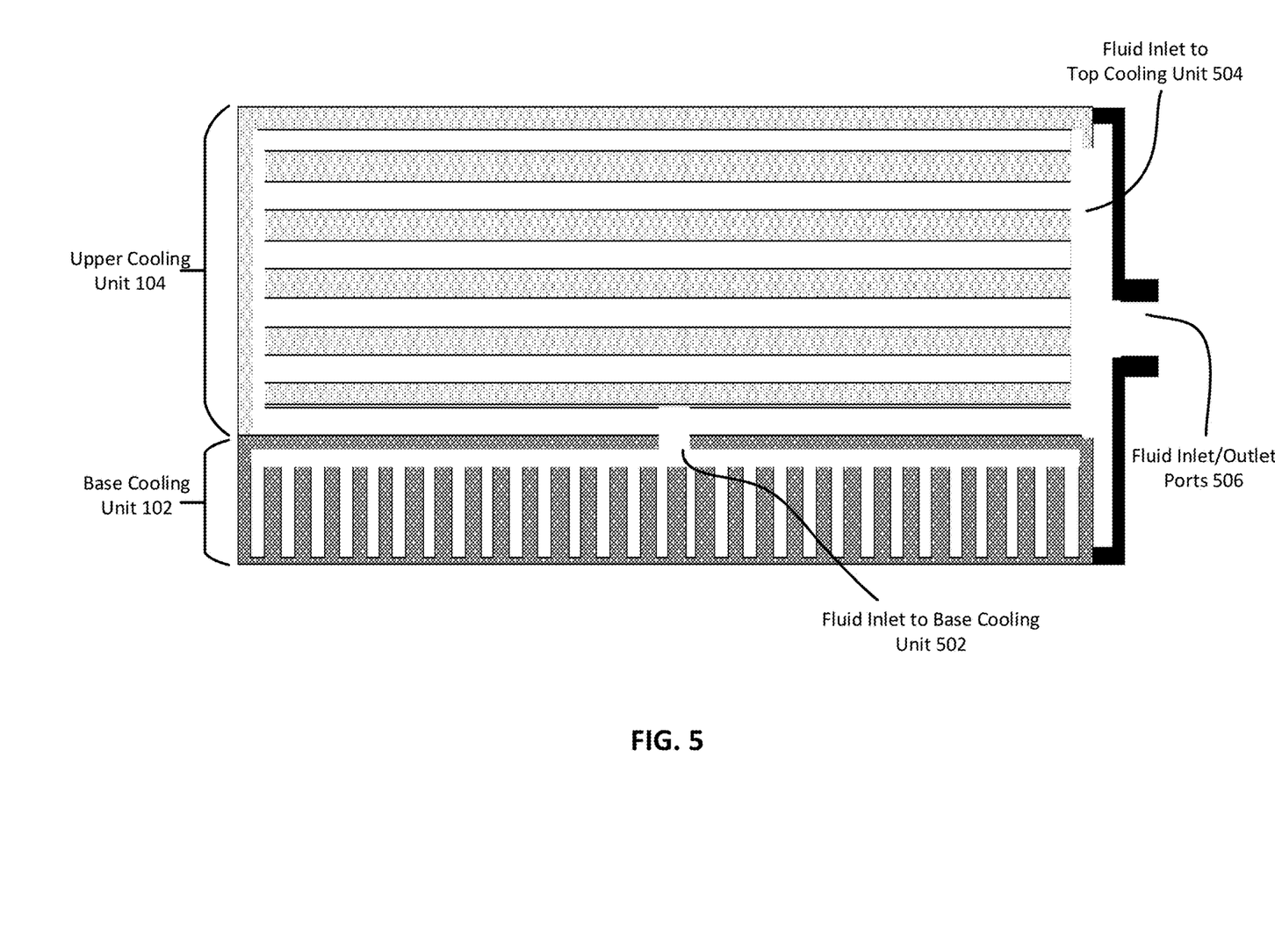
FIG. 5 shows a side view of a composite liquid cooling device according to another embodiment.

FIGS. 3-5 depict cross-sectional side views of a composite liquid cooling device according to different embodiments. FIG. 3 presents a detailed side view of a cross-section (fluid inlet as an example) of the cooling devices. It can be seen the internal fluid channel enables the fluid delivered to the top cooling unit as well as the base cooling plate after entering the fluid inlet port on the side. The detailed fluid internal channels distribute the fluid evenly across the cooling unit and the base cooling plate.

Referring to FIG. 3, the cooling device includes a base cooling unit 102, an upper cooling unit 104, and fluid inlet/outlet ports 106. Base cooling unit 102 includes base cooling unit fluid channels 315 and receives cooling liquid through a base unit liquid inlet 224. For example, a cooling liquid flows into the fluid inlet port 106 from an external source. A portion of the cooling liquid enters the base cooling unit fluid channels 315 through the base unit liquid inlet 224. The cooling liquid then flows through the base cooling unit fluid channels 315 to a fluid outlet port 106 (e.g., on the opposite end of the device from the fluid inlet port 106). The inlet/outlet ports 106 form a port unit positioned between upper unit 104 and base cooling unit 102. The cooling liquid enters the port unit via an inlet port. The cooling liquid is supplied to upper cooling unit 104 upwardly and to base cooling unit 102 downwardly. Similarly, the cooling liquid carrying the exchanged heat is returned from upper cooling unit 104 downwardly and base cooling unit 102 upwardly back to the port unit.

The base cooling unit fluid channels 315 distribute the cooling liquid evenly through the base cooling unit 102. The cooling liquid exits the base cooling unit fluid channels 315 to the fluid outlet port 106 through a base unit liquid outlet (e.g., base unit liquid outlet 228 of FIG. 2) and is returned to the cooling liquid source. The base cooling unit 102 can extract heat from an electronic device through a cooling plate on the bottom surface of the base cooling unit 102 to the cooling liquid as it flows through the base cooling unit fluid channels 315.

Upper cooling unit 104 includes upper cooling unit fluid channels 320 and receives cooling liquid from the fluid inlet/outlet ports 106 through an upper unit liquid inlet 222. For example, a portion of the cooling liquid that flows into the fluid inlet port 106 from the external source enters the top cooling unit fluid channels 320 through an upper unit liquid inlet 222. In some embodiments, as depicted in FIG. 3, the upper unit liquid inlet 222 is larger than the base unit liquid inlet 224. However, the device may include other fluid inlet size ratios different from the one depicted. The cooling liquid then flows through the top cooling unit fluid channels 320 extracting heat from the air that is in contact with the upper cooling unit 104. The upper cooling unit fluid channels 320 distribute the cooling liquid evenly through the upper cooling unit 104. The cooling liquid then exits the upper cooling unit fluid channels 320 to an upper unit liquid outlet (e.g., upper unit liquid outlet 226 of FIG. 2) which may be located on a different end of the device from the upper unit liquid inlet 222. The cooling liquid can then be recombined with the cooling liquid from the base cooling unit fluid channel 315 and returned to the external source through the fluid outlet port 106.

It should be noted that other structure and design may be used for the composite liquid cooling device, generally, as well as the upper cooling unit fluid channels 320, the base cooling unit fluid channels 315, internal fluid channel structural designs and the fluid inlet/outlet ports 106. For example, there may be additional fluid inlet and outlet ports, such as separate ports dedicated to the upper cooling unit 104 and the base cooling unit 102. The fluid channels may additionally be oriented in a different direction, include different sizes of channels, etc.

FIG. 4 shows another design method for the composite device fluid channel. The fluid inlet and outlet can be assembled or designed in any portion or side of the devices. However, different designs will result in different performance. The one shown in FIG. 4 considers the fluid inlet on the side. It can be seen the fluid inlet channels to the top cooling unit and to the base cooling unit are in parallel and their fluid inlets are also on the side.

Referring to FIG. 4, similar to the composite cooling device depicted in FIG. 3, the cooling device of FIG. 4 includes a base cooling unit 102, an upper cooling unit 104, and fluid inlet/outlet ports 406 as a part of a port unit. The base cooling unit 102 includes base cooling unit fluid channels 415 and receives cooling fluid through a base unit liquid inlet 404. The upper cooling unit 104 includes upper cooling unit fluid channels 420 and receives cooling liquid from the fluid inlet/outlet ports 406 through an upper unit liquid inlet 222. In this embodiment, the port unit having the inlet and outlet ports 406 is positioned on side across upper cooling unit 104 and base cooling unit 102. The cooling liquid received from an external cooling liquid source is supplied to upper cooling unit 104 and base cooling unit 102 in parallel.

However, as depicted in FIG. 4, the fluid inlet ports 406 and the upper unit liquid inlet 404 and base unit liquid inlet 402 are located at different points within the cooling device. The upper cooling unit 104 and base cooling unit 102 may be directly attached to one another with the fluid inlet/outlet ports 406 attached on the side. Accordingly, the upper unit liquid inlet 404 and the base cooling unit inlet 402 are also located on the side of each of the upper cooling unit 104 and the base cooling unit 102, for example, in parallel respectively. Therefore, the cooling liquid received from the external source enters and exits the upper cooling unit 104 and the base cooling unit 102 at different points and thus may provide for different distribution volumes of the liquid flow. The base cooling unit inlet 402 and the upper cooling unit inlet 404 are positioned such that the cooling liquid is received from the external cooling liquid source and then split between the upper cooling unit 104 and the base cooling unit 102. The cooling liquid therefore flows through the base cooling unit 102 and the upper cooling unit 104 in parallel and then is recombined to be returned to the external cooling liquid source.

FIG. 5 shows a design that the fluid inlet/outlet to the top cooling unit and based cooling plate are in series. These designs are presented as example for the internal fluid channel. It can be designed in different configurations for a better performance based on an actual use case. In some of design, the fluid can be used for cooling the top cooling unit first and then the base cooling unit, in some of the design, the fluid ca be used for both sections in parallel and so on.

Referring now to FIG. 5, similar to the composite cooling devices depicted in FIGS. 3 and 4, the cooling device of FIG. 5 includes a base cooling unit 102, an upper cooling unit 104, and fluid inlet/outlet ports 506 as a part of a port unit. Base cooling unit 102 includes base cooling unit fluid channels 515 and receives cooling fluid through a base unit liquid inlet 502. Upper cooling unit 104 includes upper cooling unit fluid channels 520 and receives cooling liquid from the fluid inlet/outlet ports 506 through an upper unit liquid inlet 504. In this example, the cooling liquid received from an external cooling liquid source is supplied to upper cooling unit 104 first and the cooling liquid is then supplied from the upper cooling unit 104 to base cooling unit 102 in series.

However, as depicted in FIG. 5, the fluid inlet ports 506 and the upper unit liquid inlet 504 and base unit liquid inlet 502 are located at different points within the cooling device. The upper cooling unit 104 and base cooling unit 102 may be directly attached to one another with the fluid inlet/outlet ports 406 attached on the side of the device. The upper cooling unit fluid inlet 504 is located on the side of the upper cooling unit 104 and spans nearly all of the fluid channels in the upper cooling unit 104. The fluid inlet to the base cooling unit 502 is located on the top of the base cooling unit 102 and receives the cooling liquid from the upper cooling unit 104 rather than directly from the fluid inlet port 506. As such, the cooling liquid first enters the upper cooling unit 104 and the same cooling liquid (but in different thermal conditions) then enters the base cooling unit 102 from the upper cooling unit 104 (i.e., in series). Alternatively, the cooling liquid may flow in the opposite direction such that the cooling liquid enters the base cooling unit 102 and then the upper cooling unit 104.

Figure 6:
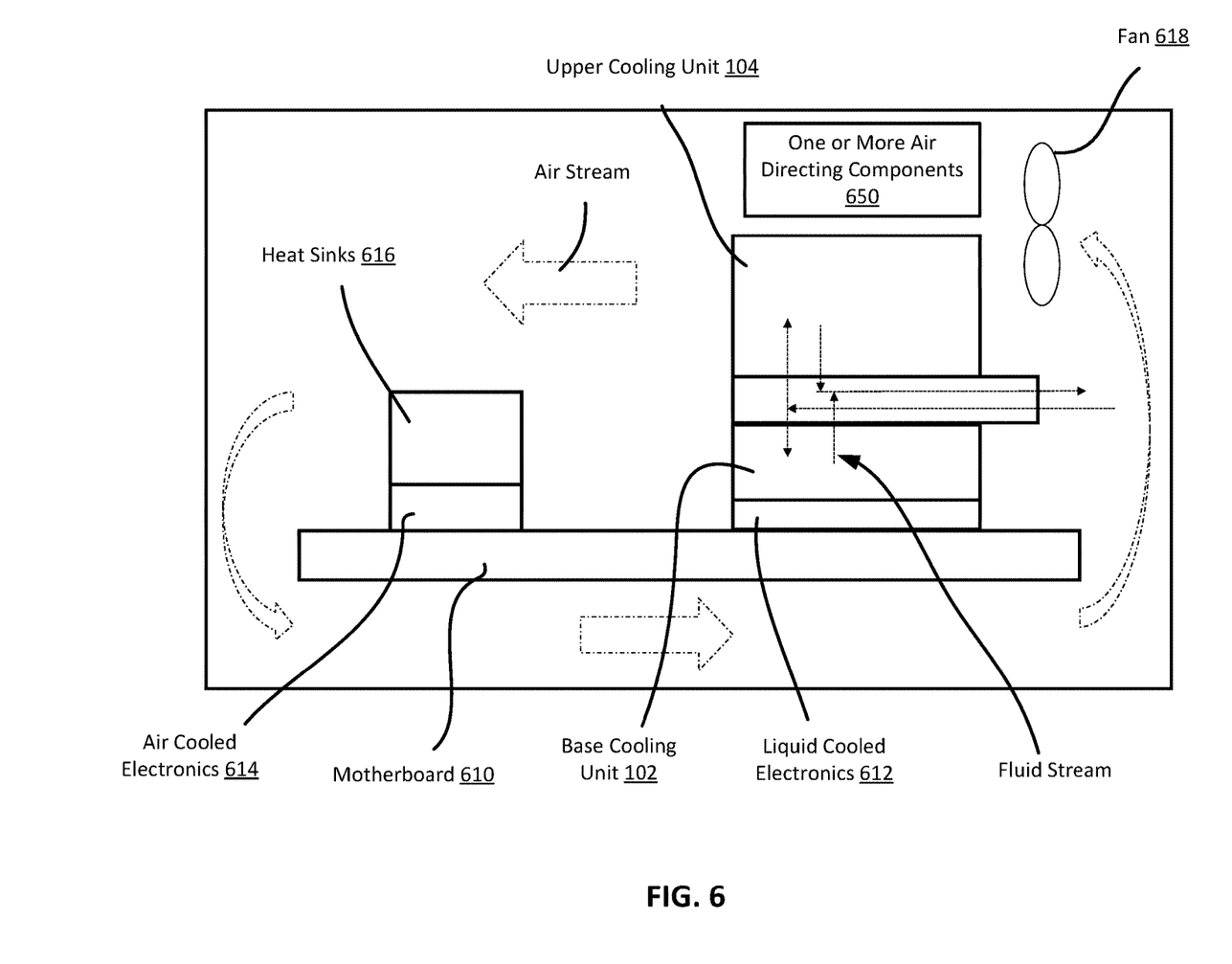
FIG. 6 shows a system using a composite liquid cooling device for liquid cooling and air cooling electronics on a motherboard.

FIG. 6 depicts an electronics system using a composite liquid cooling device to cool an electronics system with both liquid cooling and air cooling. The system may represent a data processing system such as a server having one or more electronic devices (e.g., processors) disposed on a motherboard. The system may be one of the servers of an array of server blades arranged in a stack of an electronic rack of a data center.

FIG. 6 depicts a server cooling system using multiple composite liquid cooling devices to liquid cool and air cool electronics. The composite cooling device is assembled on the liquid cooled electronics. It can be seen some of the other electronics are air cooled using heat sinks. This system can be understood as a fully enclosed system. The air is recirculating within the enclosure moving by the fan. It needs to be motioned that the fan locations can be varied based on the actual system design. The solution proposed in FIG. 1 can be also applied here. The top cooling unit can be understood as a liquid to air heat exchanger for moving the heat from the air and supplying cooling air to the heat sinks. Eventually, all the heat generated within the system extracted to the liquid. It needs to be motioned that some system may require applying air channel or air baffle for better air cooling performance or air flow management.

In one embodiment, the cooling system includes a composite liquid cooling device including a base cooling unit 102, an upper cooling unit 104, and inlet/outlet ports 106. The base cooling unit 102 and upper cooling unit 104 can include a plurality of fluid channels to distribute cooling liquid received from the fluid inlet port 106 through the cooling units (as depicted by the fluid stream). The upper cooling unit 104 extracts heat from the air flow across the surface of the upper cooling unit 104 using the cooling liquid flowing through fluid channels of the upper cooling unit 104. The base cooling unit 102 extracts heat from one or more liquid cooled electronics 612 through using the cooling liquid flowing through the fluid channels of the base cooling unit 102. The liquid cooled electronics 612 may include high performance processors or other high power density devices. The base cooling unit 102 can include a cooling plate on the bottom surface to contact the liquid cooled electronics 612, extract the heat from the liquid cooled electronics 612 and transfer the heat to the cooling liquid.

The system further includes a motherboard 610, air cooled electronics 614 attached to the motherboard 610, heat sinks 616 attached to the air cooled electronics 614, and liquid cooled electronics 612. In one embodiment, the system further includes a fan 618. The fan can be attached to the upper cooling unit 104 or may be mounted elsewhere within the enclosure. The fan 618 can move air across the upper cooling unit 104 to cool the air. The fan 618 can also circulate the air through the enclosure, as depicted by the air stream. The air that is cooled by the upper cooling unit 104 then flows along the heat sinks 616 and air cooled electronics 614, extracting heat from them. In some embodiments, an air channel or an air baffle can be included in the system to direct the flow of air to the air cooled electronics. Thus, the composite liquid cooling device acts as a liquid cooling device for the liquid cooled electronics 612 and also as an air cooling device for the air cooled electronics 614 by cooling the circulating air within the enclosure.

Figure 7:
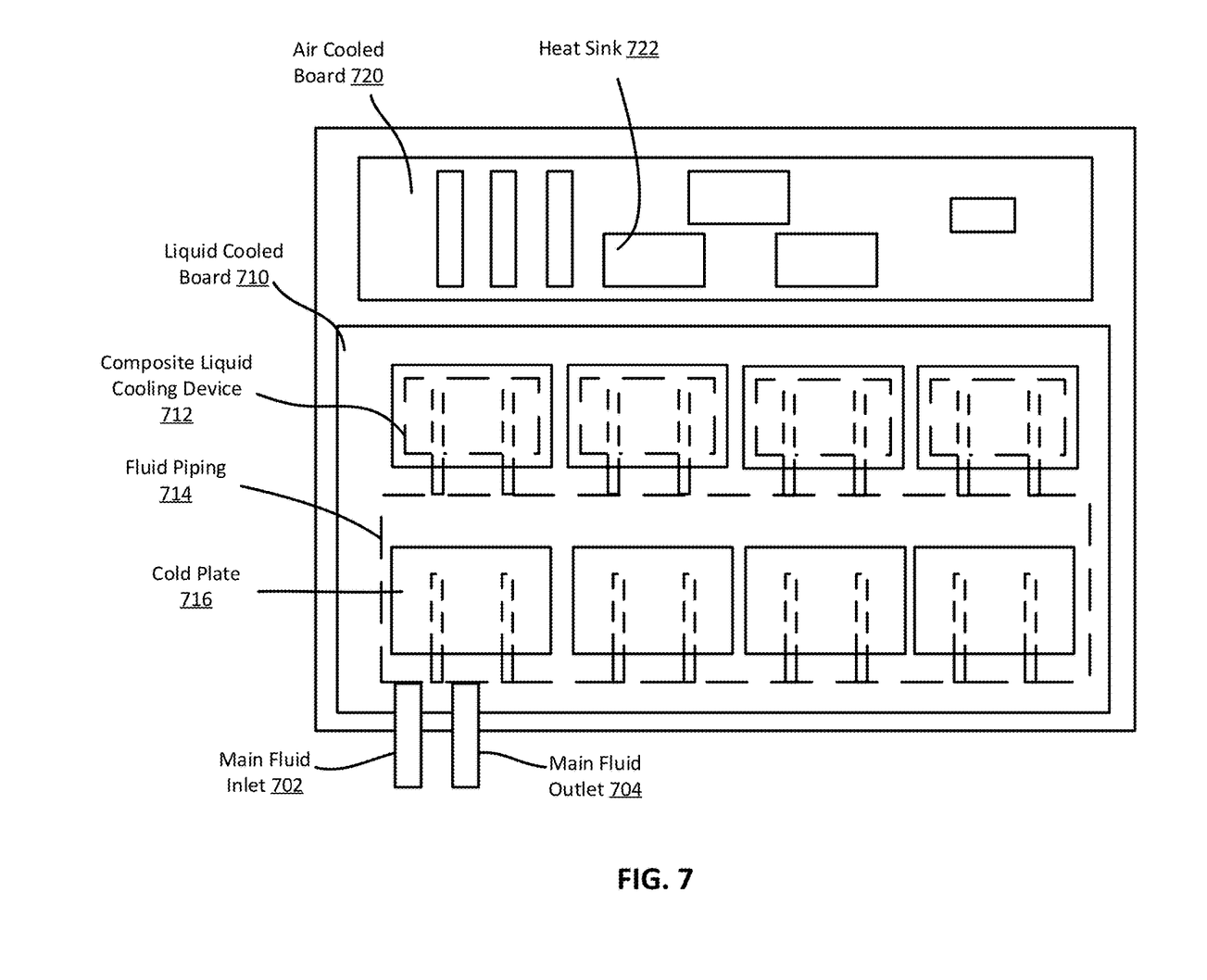
FIG. 7 shows a server cooling system using multiple composite liquid cooling devices according to one embodiment.

FIG. 7 presents another system integration using the method proposed. It can be seen that the system is partially air cooled and partially liquid cooled. The air cooled electronics are attached with heat sinks. These can be understood as lower power density devices such as PCIE switch. There maybe some of the electronics packaged on an air cooled board. The liquid cooled board can be understood as having multiple high performance processors closer to each other. These units are liquid cooled assembled with partially the composite devices proposed in the current invention and partially liquid cooling cold plate. Again, detailed fluid piping and air flow management design may need which is not shown here. Air moving fan is not presented, since it can be assembling as separate devices within the chassis or on the devices.

If the system deployed in a hybrid cooling data center which means that both cooling air source and cooling water source are available: then the top cooling section can be used as air cooling heat sink when the cooling liquid is lost. (In this application, the internal fluid channel will be supplied to the base cooling unit). When in a major fluid shut down scenario, the current devices continue functioning in a pure air cooling device. The cold plate cooled one cannot. If the system deployed in a pure liquid cooling data center, then the devices can be used for adapting hybrid cooled equipment; then either one row or both rows of the devices can be assembled with the composite cooling devices. If the system deployed in a hybrid cooling data center when the cooling air source is lost, the top cooling section then function as cooling devices for the air for cooling the air cooled board.

In one embodiment, referring to FIG. 7, the server cooling system includes an air cooled board 720 and a liquid cooled board 710. The liquid cooled board 710 is an electronics motherboard that includes a plurality of electronic devices cooled using liquid cooling devices. The electronic devices cooled using liquid cooling may be high performance processors, or other higher power density electronics. The liquid cooled electronics may also be densely distributed (i.e., closer together) on the liquid cooled board 710. Some of the electronics on the liquid cooled board 710 are cooled using a cold plate 716 while other electronic devices on the liquid cooled board 710 are cooled using a composite liquid cooling device 712. A cooling liquid is distributed to the cold plates 716 and the composite liquid cooling devices 712 using fluid piping 714. The cooling liquid is provided to the server cooling devices from the main fluid inlet 702 and leaves the server through main fluid outlet 704.

The air cooled board 720 includes electronics that are cooled using air contacting the electronics. The air cooled electronics may be devices with a low power density and which can be maintained within operational temperatures using air cooling methods. The air in the enclosure can be circulate by one or more fans to increase heat extraction to the air. Additionally, the circulating air can be cooled by an upper cooling unit of the composite liquid cooling devices 712 for extracting heat from the circulating air. The cooled air then flows across the electronics of the air cooled board to extract the heat generated by those electronics. Air baffles or air channels can direct the cooled air toward the air cooled electronics and may ensure even distribution of the cooled air. A heat sink 722 can be attached to some of the electronic devices on the air cooled board 720 to increase conductive heat transfer from the electronic devices to the air.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronics cooling device, comprising:
   an inlet port to receive a cooling liquid from an external cooling liquid source;
   a base cooling unit, comprising a cooling plate forming a lower surface to be positioned on a top surface of an electronic device, the base cooling unit having a first liquid distribution channel embedded therein to extract heat from the electronic device through the cooling plate using at least a portion of the cooling liquid received from the external cooling liquid source;
   an upper cooling unit coupled to the base cooling unit having a second liquid distribution channel to extract heat from air contacting the upper cooling unit using at least a portion of the cooling liquid received from the external cooling liquid source;
   an outlet port to return the cooling liquid from the base cooling unit and the upper cooling unit to the external cooling liquid source;
   a port unit having the inlet port and the outlet port therein responsible for circulating the cooling liquid, wherein the port unit is positioned between the base cooling unit and the upper cooling unit; and
   a fan for moving an air flow through the upper cooling unit.

2. The electronics cooling device of claim 1, wherein the base cooling unit, the upper cooling unit, the inlet port, and the outlet port are integrated and assembled together as a single composite device.

3. The electronics cooling device of claim 1, wherein the port unit is configured to supply at least a portion of the cooling liquid upwardly to the upper cooling unit and to supply at least a portion of the cooling liquid downwardly to the base cooling unit.

4. The electronics cooling device of claim 1, further comprising an air moving unit having at least one cooling fan coupled to the upper cooling unit to move air along a surface of the upper cooling unit.

5. The electronics cooling device of claim 4, wherein the upper cooling unit comprises an air-to-liquid heat exchanger.

6. The electronics cooling device of claim 1, wherein the upper cooling unit comprises a first inlet to receive the cooling liquid from the inlet port and a first outlet to return the cooling liquid to the outlet port, and wherein the base cooling unit comprises a second inlet to receive the cooling liquid from the inlet port and a second outlet to return the cooling liquid to the outlet port.

7. The electronics cooling device of claim 1, wherein the second liquid distribution channel of the upper cooling unit and the first liquid distribution channel of the base cooling unit each comprise a plurality of liquid channels to provide uniform distribution or optimized fluid distribution of the cooling liquid to the upper cooling unit and the base cooling unit.

8. The electronics cooling device of claim 1, further comprising one or more air directing components coupled to the upper cooling unit and the base cooling unit to direct airflow around the upper cooling unit.

9. A data processing system, comprising:
   a motherboard;
   an electronic device disposed on the motherboard, the electronic device includes at least one processor; and
   a cooling device positioned on a top surface of the electronic device, wherein the cooling device includes an inlet port to receive a cooling liquid from an external cooling liquid source,
   a base cooling unit, comprising a cooling plate forming a lower surface to be positioned on the top surface of the electronic device, the base cooling unit having a first liquid distribution channel embedded therein to extract heat from the electronic device through the cooling plate using at least a portion of the cooling liquid received from the external cooling liquid source,
   an upper cooling unit coupled to the base cooling unit having a second liquid distribution channel to extract heat from air contacting the upper cooling unit using at least a portion of the cooling liquid received from the external cooling liquid source;
   an outlet port to return the cooling liquid from the base cooling unit and the upper cooling unit to the external cooling liquid source;
   a port unit having the inlet port and the outlet port therein responsible for circulating the cooling liquid, wherein the port unit is positioned between the base cooling unit and the upper cooling unit; and
   a fan assembled with the upper cooling unit for moving an air flow through the upper cooling unit.

10. The data processing system of claim 9, wherein the base cooling unit, the upper cooling unit, the inlet port, and the outlet port are integrated together as a single composite device.

11. The data processing system of claim 9, wherein the port unit is configured to supply at least a portion of the cooling liquid upwardly to the upper cooling unit and to supply at least a portion of the cooling liquid downwardly to the base cooling unit.

12. The data processing system of claim 9, wherein the cooling device further includes an air moving unit having at least one cooling fan coupled to the upper cooling unit to move air along a surface of the upper cooling unit.

13. The data processing system of claim 12, wherein the upper cooling unit comprises an air-to-liquid heat exchanger.

14. The data processing system of claim 9, wherein the cooling device further includes one or more air directing components coupled to the upper cooling unit and the base cooling unit to direct airflow around the upper cooling unit.

15. An electronic rack of a data center, comprising:
a plurality of server blades arranged in a stack, each server blade having one or more servers to provide data processing services to a client, wherein each of the one or more servers comprises:
a motherboard;
an electronic device disposed on the motherboard, the electronic device includes at least one processor; and
a cooling device positioned on a top surface of the electronic device, wherein the cooling device includes
an inlet port to receive a cooling liquid from an external cooling liquid source,
a base cooling unit, comprising a cooling plate forming a lower surface to be positioned on the top surface of the electronic device, the base cooling unit having a first liquid distribution channel embedded therein to extract heat from the electronic device through the cooling plate using at least a portion of the cooling liquid received from the external cooling liquid source,
an upper cooling unit coupled to the base cooling unit having a second liquid distribution channel to extract heat from air contacting the upper cooling unit using at least a portion of the cooling liquid received from the external cooling liquid source;
an outlet port to return the cooling liquid from the base cooling unit and the upper cooling unit to the external cooling liquid source;
a port unit having the inlet port and the outlet port therein responsible for circulating the cooling liquid, wherein the port unit is positioned between the base cooling unit and the upper cooling unit; and
a fan assembled with the upper cooling unit for moving an air flow through the upper cooling unit.

16. The electronic rack of claim 15, wherein the base cooling unit, the upper cooling unit, the inlet port, and the outlet port are integrated together as a single composite device.

17. The electronic rack of claim 15, wherein the port unit is configured to supply at least a portion of the cooling liquid upwardly to the upper cooling unit and to supply at least a portion of the cooling liquid downwardly to the base cooling unit.

18. The electronic rack of claim 15, wherein the cooling device further includes an air moving unit having at least one cooling fan coupled to the upper cooling unit to move air along a surface of the upper cooling unit.

19. The electronic rack of claim 18, wherein the upper cooling unit comprises an air-to-liquid heat exchanger.

20. The electronic rack of claim 15, wherein the cooling device further includes one or more air directing components coupled to the upper cooling unit and the base cooling unit to direct airflow around the upper cooling unit.

\* \* \* \* \*